United States Patent [19]
Bohlen et al.

[11] Patent Number: 4,522,893
[45] Date of Patent: Jun. 11, 1985

[54] CONTACT DEVICE FOR RELEASABLY CONNECTING ELECTRICAL COMPONENTS

[75] Inventors: Harald Bohlen, Boeblingen; Gerhard Kaüs, Moetzingen; Johann Greschner, Pliezhausen; Joachim H. Keyser, Wildberg; Werner Külcke, Boeblingen, all of Fed. Rep. of Germany

[73] Assignee: International Business Machines Corporation, Armonk, N.Y.

[21] Appl. No.: 433,611

[22] Filed: Oct. 12, 1982

[30] Foreign Application Priority Data

Oct. 30, 1981 [EP] European Pat. Off. ........ 81109371.5

[51] Int. Cl.³ ............................................. H01J 17/00
[52] U.S. Cl. .................................... 428/641; 29/576 R; 29/577 C; 357/26; 339/17 CF; 339/278 M
[58] Field of Search ...................... 428/641; 357/26, 7; 29/576, 577

[56] References Cited

U.S. PATENT DOCUMENTS 3,525,146 8/1970 Hayashida et al. .................. 29/589
3,921,916 11/1975 Bassous ............................... 239/601
3,971,860 7/1976 Broers et al. ........................ 427/43

FOREIGN PATENT DOCUMENTS 77525 11/1970 Fed. Rep. of Germany .
2227342 1/1973 Fed. Rep. of Germany .
2555462 11/1975 Fed. Rep. of Germany .

OTHER PUBLICATIONS

R. A. Leone et al., IBM, Tech. Disclosure Bull., vol. 14, No. 2, Jul. 1971, pp. 417–418.

Primary Examiner—Veronica O'Keefe
Attorney, Agent, or Firm—Wolmar J. Stoffel

[57] ABSTRACT

Two electrical components 1 and 2 containing electric conductor lines 3 and 4 are interconnected in that one component 2 comprises silicon contact fingers 5 and a back part 6 made of silicon and carrying the fingers 5. Fingers 5 and back part 6 preferably represent an integer component of an integrated circuit provided on a monocrystalline substrate and to be connected to other electrical components. Fingers 5 and back part 6 are preferably made in accordance with micromechanical silicon semiconductor technology.

8 Claims, 7 Drawing Figures

CONTACT DEVICE FOR RELEASABLY CONNECTING ELECTRICAL COMPONENTS

TECHNICAL FIELD

The invention relates to a contact structure for releasably connecting electrical components and to a method of making them.

BACKGROUND ART

Releasable plug connections where conductor line pins of one component are inserted between spring contacts of the second component to be connected therewith, are generally known. For a low-resistance, shock proof, so-called plug connection of that type, the spring contacts are to have a high contact pressure of e.g. 10kp/cm$^2$ ~100 N/cm$^2$, and they are to have a resonance frequency which is high compared with the frequencies excitable through mechanical shocks, i.e., high compared with e.g. 10 kcps. Such contacts are practically impossible to be made in dimensions which are smaller than several millimeters. For that reason they are not suitable for many types of contacts, particularly the multiple contacts increasingly used in modern electronics.

A contact structure for releasably connecting electrical components, where no pins are inserted into spring contacts, is known from East German Patent 77 525. In this known multiple contact device, a number of closely adjacent resilient wire contacts are provided which are fixed in their position by a comb-like lateral guide. For establishing a contact, these spring wires are obliquely placed at an acute angle onto the connecting lines to be contacted. With a sliding movement, they establish the contact in a slightly bent shape. It is obvious that wires can not be decreased in their size to such an extent, from a dimension point of view, that they can be used for electronic components.

With an increasing miniaturization, the conductor line connections have to have dimensions which are e.g. considerably below 1 mm. Variations of this type can be implemented up to a size of approximately 0.5 mm by means of solder connections. These solder connections however are rigid, and their important disadvantage is that they are not releasable.

DISCLOSURE OF INVENTION

The invention as characterized in the claims achieves the object of providing a releasable contact device with flexible, position-stable contact fingers in hitherto unknown small dimensions, which can be used in modern electronics for which they represent a prerequisite.

The advantages achieved by the invention substantially consist in that the silicon contact fingers and their connector carrying them can be made sufficiently small, stable in their position, and flexible, so that the conductor line widths to be connected are much below the range of 1 to ½ mm. For their production, fully developed methods of semiconductor technology can be easily applied in an advantageous manner. The contact fingers, to give an example, can be made in a thickness and width of several micrometers only, and in a length in the order of millimeters, the contact resistance being in the range of several 10 Ohm, the possible contact pressures being approximately 100 N/cm$^2$, and the resonance frequencies being more than 10 kcps. The production of mechanical components made of silicon is not novel per se. German Offenlegungsschrift (unexamined patent application) 2 227 342 for instance describes the production of a very fine pattern of openings in silicon, the silicon being used as a carrier material in a very thin layer. Furthermore, the article in IBM Technical Disclosure Bulletin, Vol. 14 No. 2 July 1971 P. 417 and 418 describes a method of making silicon masks with windows.

German Patent Application 2 555 462 describes a method of making nozzle openings in a monocrystalline silicon wafer with a diameter of approximately 25 m. Individual nozzles, or a multitude of closely adjacent nozzles can be made which are used e.g. in ink jet printers. The nozzles are made by means of etching technique with differently doped layers.

From a mechanical point of view, the openings in these known silicon components are made in the silicon material, i.e. the silicon material surrounds the opening so that no self-supporting part is produced. Additionally, these known silicon components do not have a current-conducting function for interconnecting electrical components or circuits, respectively.

BRIEF DESCRIPTION OF DRAWINGS

In the following, structure and operation of the invention will be described in detail with reference to the drawing which only represents an embodiment. The drawing shows the following.

BEST MODE FOR CARRYING OUT INVENTION

Figure 1:
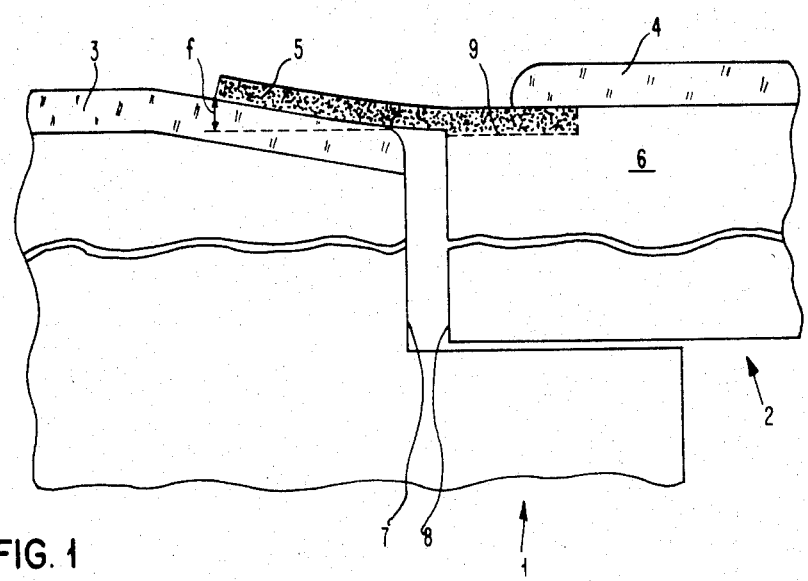
FIG. 1 is a lateral view of the contact device in accordance with the invention.
Figure 2:
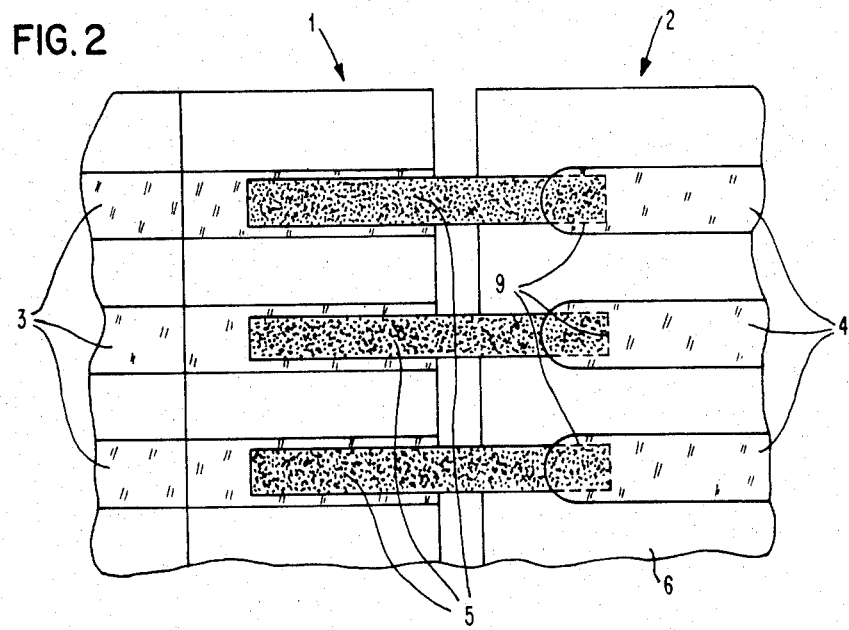
FIG. 2 is a plan view of the contact device which is shown in FIG. 1 and designed in accordance with the invention.

FIGS. 1 and 2 show in a lateral view and in a plan view, respectively, two electrical components 1 and 2 to be interconnected. Component 1 comprises several conductor lines 3 which in the region shown in the figure extend in parallel to each other. The second component 2 also comprises electrical conductor lines 4. The distance between conductor lines 3 and 4 is substantially the same in the connecting area. To connect the two components 1 and 2, or to connect conductor lines 3 and 4 provided thereon, component 2 comprises according to the invention protruding fingers 5 arranged in the spacing of conductor lines 3 and 4, respectively. Fingers 5 are interconnected by a back 6, and are advantageously made in one piece of the substrate or carrier material of component 2. Component 1 has an angular recess 7 into which engages a dimensionally corresponding corner 8 of back 6. In the area where conductor lines 3 of component 1 contact fingers 5 they are inclined, as shown in FIG. 1. If both components 1 and 2 are interleaved by fixtures not shown, so that corner 8 of back 6 engages in the correspondingly formed recess 7 of component 1, fingers 5 rest on the inclined parts of conductor lines 3 in such a way that they bend by an amount f. This bending of fingers 5 effects the pressure required for establishing a contact. The fixtures holding components 1 and 2 together are not shown in the figures.

According to the invention, fingers 5 are made of silicon, like back 6 carrying them. It is of advantage when fingers 5 and back 6 are made of one piece, i.e. when fingers 5 are processed out of a silicon substrate together with back 6. The silicon material forming finger 5 is of such a conductivity that a minimum-resistance connection is established between conductor lines 3 of component 1 and conductor lines 4 of component 2. Such a conductivity of fingers 5 can be achieved by means of a highly doped, well-conducting silicon layer. For the doping, boron is preferably used in a concentration of approximately $10^{19}$–$10^{20}$ atoms/cm$^3$.

Width b of fingers 5 is advisably smaller than the distance between two conductor lines 3 and 4, respectively, to make sure that if fingers 5 are not placed correctly onto the other component 1 to be contacted they do not effect a short between two adjacent conductor lines 3 of this component 1.

As shown by FIGS. 1 and 2, conductor lines 4 of component 2 extend over electrically conductive areas of fingers 5 represented by dashed line 9 of FIG. 2. Owing to the fact that only the silicon areas of fingers 5 are highly doped, or well-conductive electrically, respectively, it is made sure that there can be no shorts between conductor lines 4 of component 2 fitted with contact fingers 5.

Back part 6 with flexible contact fingers 5 is advantageously made in accordance with micromechanical silicon semiconductor technology.

An advantageous manufacturing process will be described below with reference to FIG. 3. Into a monocrystalline silicon substrate 10, an electrically conductive layer 11 is introduced, e.g. by doping substrate 10 with approximately $10^{20}$ boron atoms/cm$^3$. This layer 11 is introduced in the finger area as far as required in accordance with FIGS. 1 and 2 so that the conductive areas as indicated by dashed line 9 reach up to beneath conductors 4 of component 2. Silicon substrate 10 is depicted in a broken-off line in FIG. 3A, which means that the part with the fingers and back 6 is part of a component 2, e.g. of an integrated circuit which comprises as a substrate the above-mentioned substrate 10, and into which the electrical components of interest are inserted in accordance with semiconductor technology. The present context does not demand a detailed discussion of these circuits. Conductive layer 11, highly boron-doped silicon, is introduced in substrate 10 in a thickness exceeding by some μm the future thickness h of fingers 5. This electrically conductive layer 11 is shown in a cross-section in FIG. 3A, and in other figures its limit is indicated by dashed line 9.

Figure 3A:
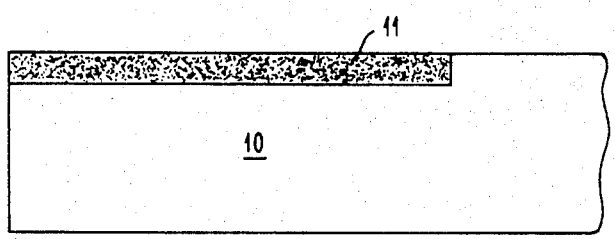
FIGS. 3A through E are schematically, different steps in the production of the contact device in accordance with the invention, partly in a lateral view and partly in a plan view.
Figure 3B:
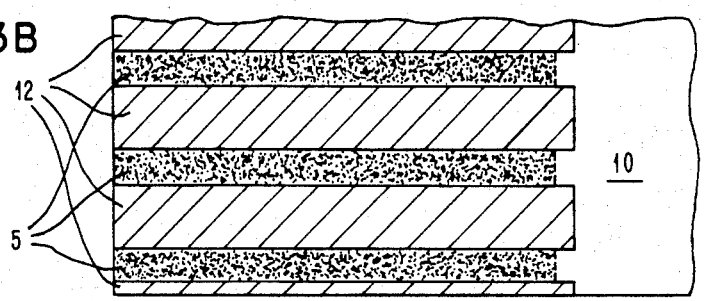

After photolithographic structurization, interspaces 12 between fingers 5 are etched out of highly boron-doped layer 11, with an SiO$_2$-layer being used as an intermediate mask. This etching-out of interspaces 12 is effected depth-wise by some μm all through highly boron-doped layer 11 into the undoped material of silicon substrate 10. It is thus made sure that boron-doped areas 11 have now adopted the stripe-shaped finger form as indicated in FIG. 3B, so that there is no connection between the electrically conductive regions. The structurization of highly boron-doped layer 11, or the providing of interspaces 12 is implemented by anisotropic reactive ion etching in an Ar/Cl$_2$ atmosphere. FIG. 3B represents the result of this structurization in a plan view. The depth-wise setting-off of recesses 12 and highly boron-doped layer 11 is depicted e.g. in FIGS. 3C and 3E, the limit of highly boron-doped layer 11 being represented by dashed line 9, and the depth of recesses 12 by dash-dotted line 13.

Figure 3C:
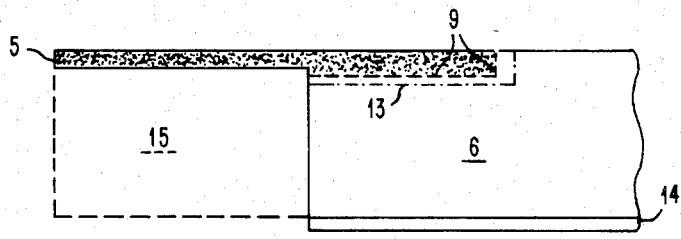

The back or the lower side, respectively, of silicon substrate 10 is subsequently covered with an SiO$_2$-layer 14, with the exception of the part by which fingers 5 are subsequently to protrude over substrate 10 or back 6, respectively, in a free projection, i.e., with the exception of length 1 of the fingers. The free undoped silicon of substrate 10 is subsequently etched off down to highly boron-doped layer 11, i.e. down to the region of fingers 5, as shown in FIG. 3C where dashed zone 15 depicts the undoped and uncovered silicon to be etched off. This etching is effected e.g. through anisotropic, preferential wet etching with ethylene diamine, pyrocatechol and water.

After the forming of recesses 12 shown in FIG. 3B, and the subsequent removal of undoped silicon in area 15, shown in FIG. 3C there remains as a result a structure of a series of parallel fingers 5 freely protruding from back 6 or substrate 10, respectively, of a predetermined width b, length l, and thickness h. This result is represented in a plan view in FIG. 3D, and in a lateral view FIG. 3E.

Figure 3D:
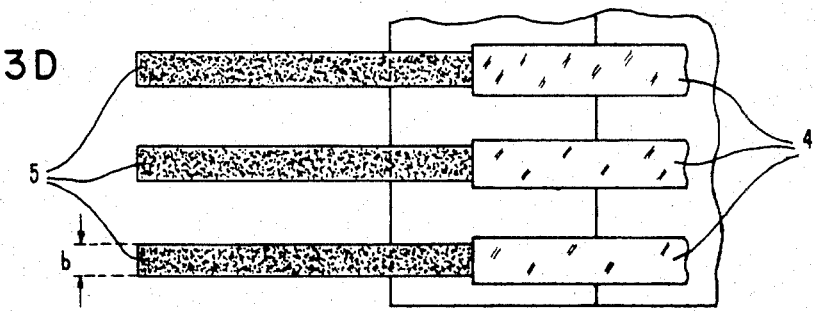
Figure 3E:
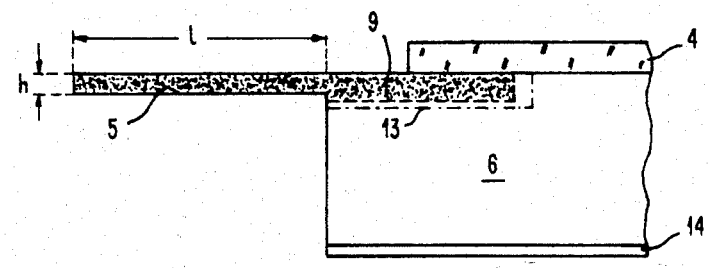

FIGS. 3D and 3E show conductor lines 4 applied following the production of the fingers, said conductor lines extending over a large part of the highly doped, striped-shaped electrically conductive regions indicated with reference number 9 in FIGS. 3C and 3E. Where conductor lines 4 and electrically conductive regions 11 overlap there is an electrical contact between them.

Owing to the high boron-doping of silicon substrate 10 in regions 11 the electric resistances of fingers 5 are very low. With a boron-doping of $10^{20}$ atoms/cm$^3$, the silicon has a resistivity of only $\rho \simeq 10^{31\ 3}$ Ohm.cm. In view of this resistance value which seems low enough for the intended purpose the element can be used as a connecting contact. For these reasons it is not necessary, with respect to conductivity, for the fingers to be additionally equipped with a metallic coating which however may be advantageous for reasons of elasticity.

The contact device designed in accordance with the invention shows in FIG. 3E e.g. non-deflected finger 5 with a length l, a thickness h, and a width b (see Fig. 3D).

The same arrangement is depicted in FIG. 1 in the position in which the finger is bent by amount f from its stationary position. Bend f must not exceed a maximum extent. Maximum bend $f_{MAX}$ is given by the admissible maximum bend tension of silicon.

A typical exemplary dimensioning of a silicon contact device in accordance with the invention, as shown in the figures results in the following for bend f at the free extreme end of finger 5, in accordance with the relations of the bar fixed at one end and being applied at its free end with a force F and a contact pressure $P = F/b^2$, respectively:

$$f = 4 \frac{1}{E} \frac{l^3}{h^3} b P$$

and for the maximum bend $$f_{MAX} = \frac{2}{3} \frac{l^2}{h} \frac{k_B}{E}.$$

Maximum contact pressure $P_{MAX}$ is $$P_{MAX} = \frac{1}{6} \frac{h^2}{bl} k_B$$

which can be reached with thickness or height h, width b, and length l with the admissible bend tension $k_B$ of silicon. The contact area onto which acts contact pressure P is defined with $b^2$.

Another characteristic parameter which is of importance with respect to contacting is the vibration frequency n of contact spring 5 which is calculated following the fundamental oscillation of a prismatic rod fixed at one side and made of a material with the specific weight $\gamma$, as $$n = 5.05 \frac{E}{\gamma} \cdot \frac{h}{l^2}$$

In the above-mentioned equations, the parameters used are:
- f — the bend of the extreme end of the finger
- l — length of the finger
- b — width of the finger
- h — thickness of the finger
- F — the force applied at the extreme end of the finger
- $P = F/b^2$ contact pressure between finger and contacted conductor line
- E — elasticity modul
- $k_B$ — admissible bend tension
- $f_{MAX}$ — maximum bend prior to rupture.

The electric resistance R of the contact finger is $$R = \rho \frac{l}{bh}$$

$\rho$ being the resistivity of the material.

In the silicon used with a doping of $10^{20}$ boron atoms/cm$^3$, the material constants are the following:

$k_B = 3 \cdot 10^4$ N/cm$^2$ $E = 1.7 \cdot 10^7$ N/cm$^2$ $\gamma = 2.7 \cdot 10^{-2}$ N/cm$^3$ $\rho = 10^{-3} \Omega \cdot$ cm, with 1 N = 1 Newton ~ 0.1 kp.

From the above given values, the following values for two embodiments for differently designed contact fingers 5 are obtained:

$l = 3 \cdot 10^{-2}$ cm = 0.3 mm   $P_{MAX} = 170$ N/cm$^2$   (1.)

$b = 1 \cdot 10^{-3}$ cm = 10 $\mu$m   $f_{MAX} = 10$ $\mu$m $h = 1 \cdot 10^{-3}$ cm = 10 $\mu$m   $n = 140$ kcps $R = 30 \Omega$ $l = 2 \cdot 10^{-1}$ cm = 2 mm   $P_{MAX} = 500$ N/cm$^2$   (2.)

$b = 5 \cdot 10^{-3}$ cm = 50 $\mu$m   $f_{MAX} = 47$ $\mu$m $h = 1 \cdot 10^{-2}$ cm = 100 $\mu$m   $n = 32$ kcps $R = 4 \Omega$ The above-given values of embodiments show that the dimensioning of the fingers can be optimally adapted to the respective case of use in accordance with the given conductor line width and fields of application. It is surely of considerable importance that a component of integrated technology, basing on monocrystalline silicon as a source material has its own contacts in the form of the silicon fingers designed in accordance with the invention via which it can be connected to other electrical components or their conductor lines, and contacted therewith.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. A pressure contact connection structure for electrically connecting electrical components where each component has a series of closely spaced terminals along the edges of the top surface thereof comprising,
   a series of parallel, protruding, spaced fingers extending outwardly from the top surface of the first of said components, said fingers formed of low resistively monocrystalline silicon and being integral with said first component, said fingers electrically connected to said terminals on said first component
   an abutment surface on the second of said components that is depressed from said top surface,
   a plurality of closely spaced terminals on the surface of said second component above said abutment surface, which terminal spacing corresponds to the spacing of said fingers,
   said first and second components assembled with a bottom surface of said first component in engagement with said abutment surface on said second component and said plurality of fingers in flexed engagement with said terminals on said second component.

2. The connection structure of claim 1 wherein said first component is a silicon integrated circuit semiconductor device, and said device and fingers are integral.

3. The connection structure of claim 1 wherein said fingers are doped with boron in a concentration in the range of $10^{19}$–$10^{20}$ atoms/cm$^3$.

4. The connection structure of claim 1 wherein said first component is a device carrier formed of monocrystalline silicon material.

5. The connection structure of claim 1 wherein the width of said fingers on said first electrical component is less than the distance between said terminals on said second electrical component.

6. The connection structure of claim 1 wherein said terminals on said second electrical component are a plurality of surface metal stripes, and wherein the end portions adjacent the edge are inclined downwardly, said fingers making contact with said metal stripes on said downwardly inclined end portions.

7. The connection structure of claim 6 wherein said abutment surface of said second electrical component is located below the plane of the major surface thereof by the amount of the thickness of said first component.

8. The connection structure of claim 1 wherein said fingers each have a thickness in the range of 10 to 100 $\mu$m, a width in the range of 10–50 $\mu$m, and a length in the range of 0.3 to 2 mm.

* * * * *

UNITED STATES PATENT AND TRADEMARK OFFICE
CERTIFICATE OF CORRECTION

PATENT NO. : 4,522,893

DATED : June 11, 1985

INVENTOR(S) : H. Bohlen, G. Kaus, J. Greschner, J.H. Keyser and W. Kulcke

It is certified that error appears in the above-identified patent and that said Letters Patent is hereby corrected as shown below:

Col. 4, line 34, the formula should read:

$$\tilde{p} = 10^{-3}$$

Signed and Sealed this

Twenty-ninth Day of October 1985

[SEAL]

Attest:

Attesting Officer

DONALD J. QUIGG

Commissioner of Patents and Trademarks—Designate